(12) United States Patent
Tuan et al.

(10) Patent No.: US 6,562,681 B2
(45) Date of Patent: May 13, 2003

(54) NONVOLATILE MEMORIES WITH FLOATING GATE SPACERS, AND METHODS OF FABRICATION

(75) Inventors: Hsing T. Tuan, Cupertino, CA (US); Vei-Han Chan, San Jose, CA (US); Chung-Wai Leung, Milpitas, CA (US); Chia-Shun Hsiao, Hsin-Chu (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/881,288

(22) Filed: Jun. 13, 2001

(65) Prior Publication Data

US 2002/0190305 A1 Dec. 19, 2002

(51) Int. Cl.$^7$ ............................................. H01L 21/336
(52) U.S. Cl. ...................... 438/257; 438/258; 438/259; 438/266; 438/267; 438/296
(58) Field of Search ................... 438/257, 258, 438/259, 266, 267, 296, 315, 316

(56) References Cited

U.S. PATENT DOCUMENTS

| | | | |
|---|---|---|---|
| 6,013,551 A | 1/2000 | Chen et al. | 438/264 |
| 6,130,129 A * | 10/2000 | Chen | 438/257 |
| 6,171,909 B1 | 1/2001 | Ding et al. | 438/267 |
| 6,200,856 B1 | 3/2001 | Chen | 438/257 |
| 6,261,903 B1 | 7/2001 | Chang et al. | 438/257 |
| 6,335,243 B1 * | 1/2002 | Choi et al. | 438/257 |

OTHER PUBLICATIONS

S. Aritome et al., "A 0.67um$^2$ Self–Aligned Shallow Trench Isolation Cell (SA–STI Cell) for 3V–256 Mbit NAND EEPROMs", IEEE Tech. Dig. Of IEDM, 1994, pp. 61–64.

R. Shirota, "A Review of 256Mbit NAND Flash Memories and NAND Flash Future Trend", Nonvolatile Memory Workshop, Monterey, California, Feb. 2000, pp. 22–31.

* cited by examiner

Primary Examiner—David Nelms
Assistant Examiner—Mai-Huong Tran
(74) Attorney, Agent, or Firm—Skjerven Morrill LLP; Michael Shenker

(57) ABSTRACT

In a nonvolatile memory, a floating gate includes a portion of a conductive layer (150), and also includes conductive spacers (610). The spacers increase the capacitive coupling between the floating gate and the control gate (170).

32 Claims, 5 Drawing Sheets

NONVOLATILE MEMORIES WITH FLOATING GATE SPACERS, AND METHODS OF FABRICATION

BACKGROUND

The present invention relates to semiconductor technology, and more particularly to nonvolatile semiconductor memories.

FIG. 1 illustrates a cross-section of a conventional nonvolatile semiconductor memory. Active areas 120 in silicon substrate 130 are isolated from each other by field oxide regions 134. Gate oxide 140 is grown over the active areas. A polysilicon layer 150 is deposited over the gate oxide and patterned to provide a floating gate over each active area. Insulating layer 160 (e.g. ONO, i.e. a combination of a silicon oxide layer, a silicon nitride layer, and another silicon oxide layer) is formed over the floating gates. A polysilicon layer 170 is deposited and patterned to provide the control gates. See S. Aritome et al., "A 0.67 um$^2$ Self-Aligned Shallow Trench Isolation Cell (SA-STI Cell) for 3V-Only 256 Mbit NAND EEPROMs", IEEE Tech. Dig. of IEDM, 1994, pages 61–64.

Field oxide 134 is formed by a well-known LOCOS process in which the field oxide, and hence the active areas 120, are defined by a photoresist mask separate from a mask which later defines the floating gates 150. To accommodate a possible mask misalignment, the floating gates overlap the field oxide regions 134. The overlapping portions ("wings") 150W of gates 150 undesirably increase the memory size, but they advantageously increase the capacitive coupling between the floating gates 150 and the control gate 170.

To reduce the memory size, polysilicon layer 150 can be self-aligned to active areas 120, as illustrated in FIGS. 2, 3 and described in the Aritome article cited above. Gate oxide 140 and polysilicon 150 are formed over the substrate 130 before formation of field oxide 134. A silicon dioxide layer 210 ("cap oxide") is formed over the polysilicon 150. Then a mask (not shown) is formed defining the active areas 120. Layers 210, 150, 140 are patterned as defined by that mask, and the exposed regions of substrate 130 are etched to form isolation trenches 220. Then silicon dioxide 134 is deposited to fill the isolation trenches and cover the rest of the structure. Oxide 134 is etched back (FIG. 3). Polysilicon 150 becomes exposed. Then "inter-poly" insulator 160 and control gate polysilicon 170 are deposited and patterned as in FIG. 1.

Elimination of wings 150W reduces the memory size but decreases the capacitive coupling between the floating and control gates. To improve the capacitive coupling, the etch of silicon dioxide 134 partially exposes sidewalls 150SW of floating gates 150. Polysilicon 170 comes down along the exposed sidewall portions, so the capacitive coupling is increased.

Another structure is disclosed in R. Shirota, "A Review of 256 Mbit NAND Flash Memories and NAND Flash Future Trend", Nonvolatile Memory Workshop, Monterey, Calif., February 2000, pages 22–31. In that structure, before formation of inter-poly insulator 160, an additional polysilicon layer is deposited, and is patterned with a separate mask, so that the structure has a floating gate consisting of two polysilicon layers. The additional polysilicon layer extends over the field oxide regions 134.

SUMMARY

In some embodiments of the present invention, a floating gate is made from two polysilicon layers, but the second one of the two polysilicon layers is patterned without a separate mask. In some embodiments, the second layer is formed by a conformal deposition followed by a blanket anisotropic etch to provide polysilicon spacers in physical contact with the first layer.

The invention is not limited to embodiments which do not require an additional mask, or to embodiments in which the floating gate is made of two layers, or to embodiments using polysilicon. Some embodiments use LOCOS isolation technology. Other features of the invention are described below. The invention is defined by the appended claims.

DESCRIPTION OF PREFERRED EMBODIMENTS

Figure 1:
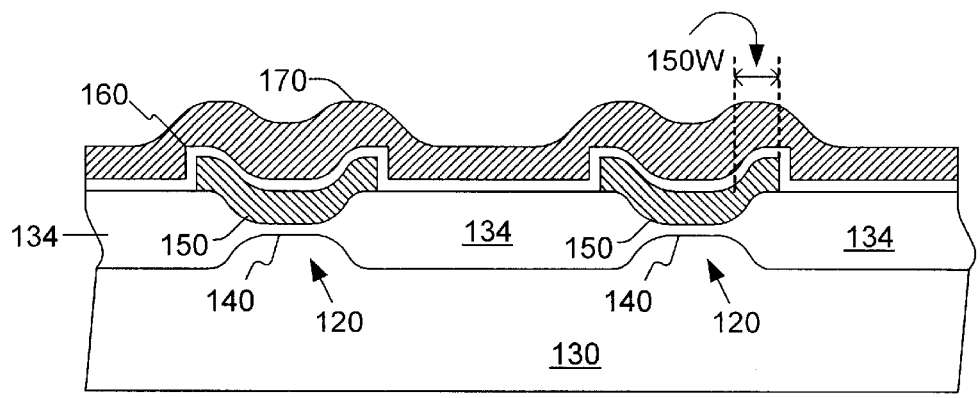
FIGS. 1–3 are cross-section illustrations of prior art semiconductor memories.
Figure 2:
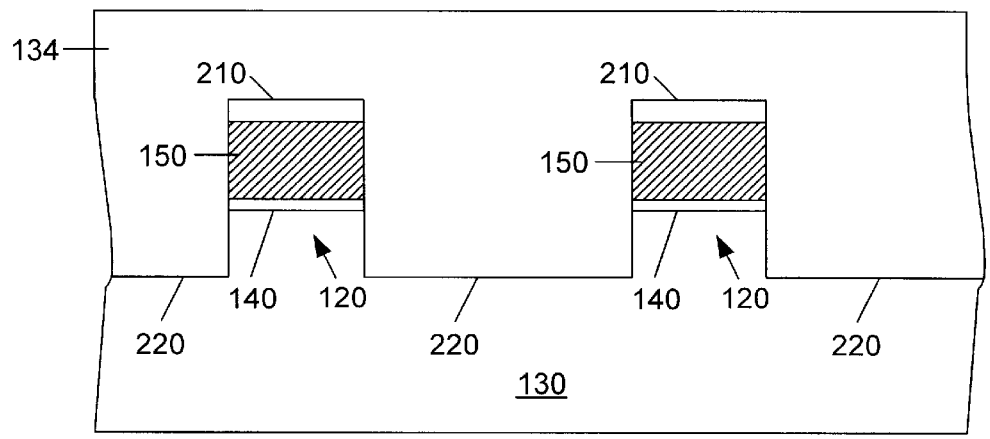
Figure 3:
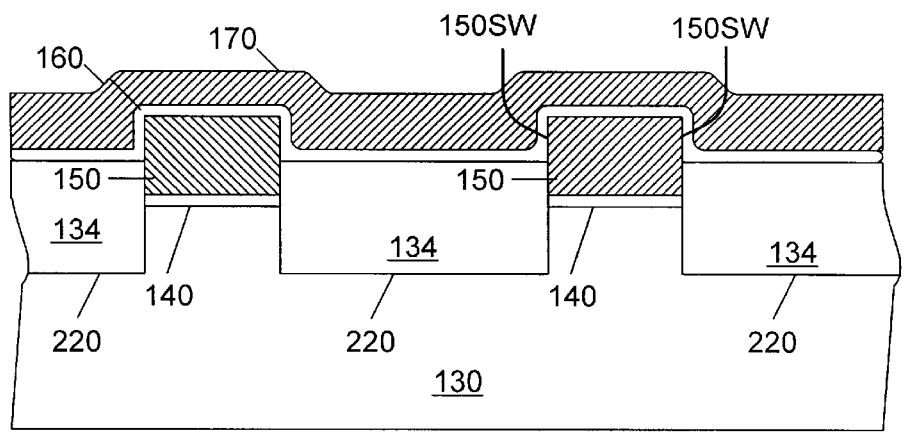
Figure 4:
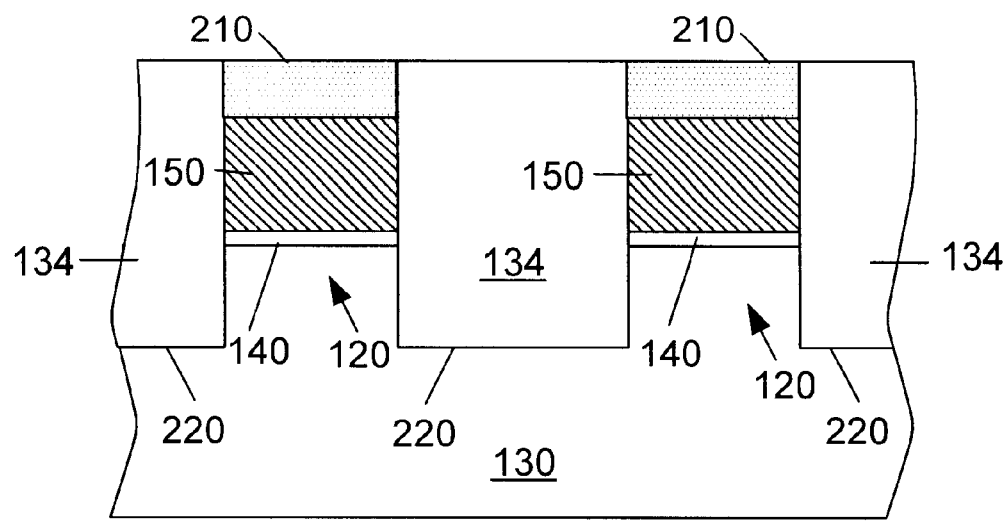
FIGS. 4–11 are cross-section illustrations of semiconductor memory structures according some embodiments of the present invention.

FIG. 4 illustrates a cross-section of a nonvolatile memory structure at an early stage of fabrication. Floating gate polysilicon layer 150 is made self-aligned to active areas 120 using well-known shallow trench isolation technology (STI), substantially as in FIG. 2. In the illustrative embodiment being described, substrate 130 is a suitably doped (e.g. p-doped) monocrystalline silicon substrate; appropriate wells (not shown) have been formed in the substrate, as described in U.S. patent application Ser. No. 09/640,139 entitled "Nonvolatile Memory Structures and Methods of Fabrication", filed Aug. 15, 2000 by H. T. Tuan et al., incorporated herein by reference, now U.S. Pat. No. 6,355,524, issued Mar. 12, 2002. Other types of substrates, including non-silicon substrates, can also be used. The invention is not limited by any particular wells or doping types.

Insulator 140 is formed over substrate 130. In the embodiment being described, insulator 140 is silicon dioxide formed as described in the aforementioned U.S. patent application Ser. No. 09/640,139. We will refer to this insulator as "tunnel oxide" because in the embodiment being described the memory cell can be erased by the Fowler-Nordheim tunneling of electrons from the floating gate to substrate 130. The invention is not limited to Fowler-Nordheim tunneling or silicon dioxide.

Then doped polysilicon layer 150 is deposited. (Polysilicon 150 can be doped during or after deposition. Non-polysilicon conductive layers can also be used.) Then layer 210, for example, silicon nitride, is formed over the layer 150. Then a photoresist mask (not shown) is formed over the structure using photolithographic technology. The mask defines active areas 120 and isolation trenches 220. Nitride 210, polysilicon 150, oxide 140, and substrate 130 are etched through the openings in this mask. (Alternatively, the photoresist may be stripped after the etch of nitride 210 before the etch of polysilicon 150, but this is not necessary.) Isolation trenches 220 are formed in the substrate. Insulator 134, for example, silicon dioxide, is deposited to fill the trenches and cover the structure. Oxide 134 is polished by chemical mechanical polishing (CMP). The CMP stops on nitride 210. These steps can be performed as in the aforementioned U.S. patent application Ser. No. 09/640,139, though other techniques and materials can also be used.

Then a blanket etch of oxide 134 is performed which partially exposes the sidewalls 150SW (FIG. 5) of polysilicon 150. In one embodiment, the etch is a buffered HF etch, with the ratio of water to HF being 100:1 by volume. In another embodiment, a dry anisotropic $CF_4/CHF_3$ etch is used. The invention is not limited to any particular etching process.

Figure 6:
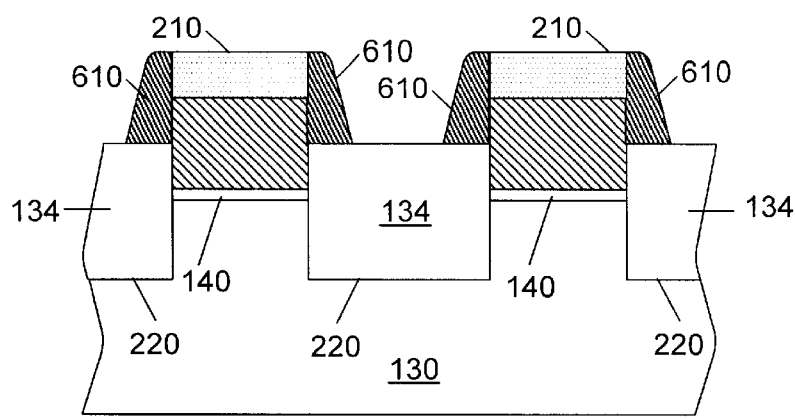

A conformal conductive layer 610 (FIG. 6) is deposited and etched anisotropically without a photolithographic mask to form spacers on the exposed sidewalls of silicon nitride 210 and polysilicon 150. In some embodiments, layer 610 is doped polysilicon of the same conductivity type and doping concentration as polysilicon layer 150. Polysilicon 610 can be deposited by low pressure chemical vapor deposition (LPCVD), and can be doped during or after deposition. Layer 610 can be etched by a conventional dry anisoptropic etching process. Other materials and fabrication processes can also be used. The floating gates will be formed from the layers 150, 610.

In an exemplary embodiment, polysilicon 150 is 120 nm thick. Oxide 134 is etched down 60 nm below the top surface of layer 150. Silicon nitride 210 is 85 nm thick. Hence, the spacers are 60+85=145 nm in height.

In some embodiments, the etch of layer 610 is a masked etch. The mask is used to form peripheral circuitry features.

Figure 7:
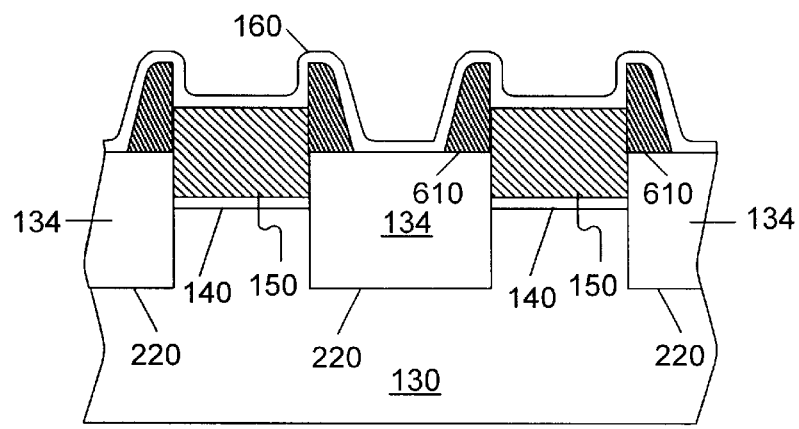

Nitride 210 is removed, and an insulating layer 160 (FIG. 7) is formed over the structure. In some embodiments, layer 160 is ONO formed as described in the aforementioned U.S. patent application Ser. No. 09/640,139. More particularly, a thin oxide layer is grown on the exposed polysilicon 150, 610 by thermal oxidation. This step smoothens the top corners of spacers 610. (Therefore, the enhancement of the electrical field at the corners will advantageously be reduced when the memory is operated.) Then a silicon nitride layer and another silicon dioxide layer are deposited by chemical vapor deposition (CVD) to complete the formation of ONO 160.

Figure 8:
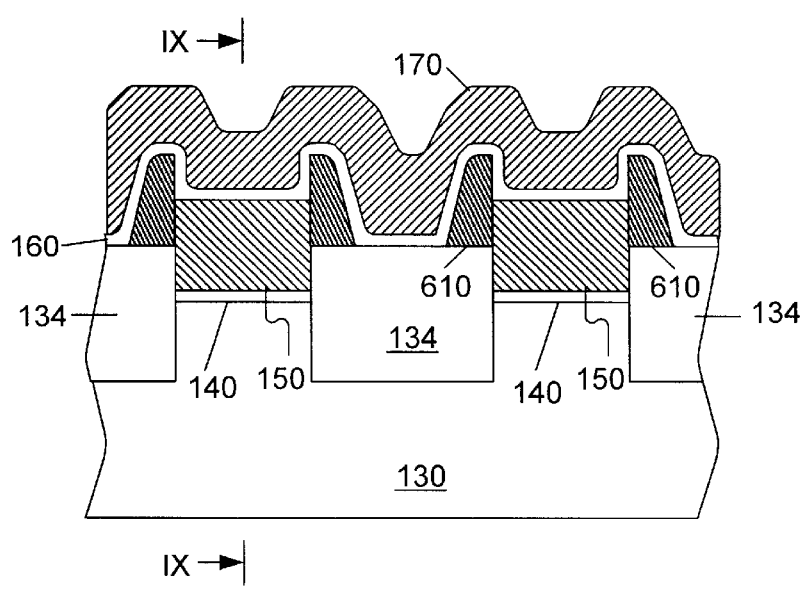

A conductive layer 170 (FIG. 8) is deposited over ONO 160. This layer provides the memory control gates. In some embodiments, layer 170 is doped polysilicon deposited by LPCVD as described in the aforementioned U.S. patent application Ser. No. 09/640,139. Layer 170 is patterned as desired. Spacers 610 increase the area of the capacitor formed by the control gate 170 and the floating gate 150, 610 and thus increase the capacitive coupling between the control and floating gates. The dimensions of the spacers formed from layer 610 depend partially on the thickness of silicon nitride 210 (FIG. 6) and thus are less dependent on the height of the exposed portions of sidewalls 150SW. This is advantageous because the height of the exposed sidewall portions is defined by the etch of field oxide 134. The field oxide etch is a timed etch in some embodiments, which is not as well controlled as the thickness of nitride 210.

Figure 9:
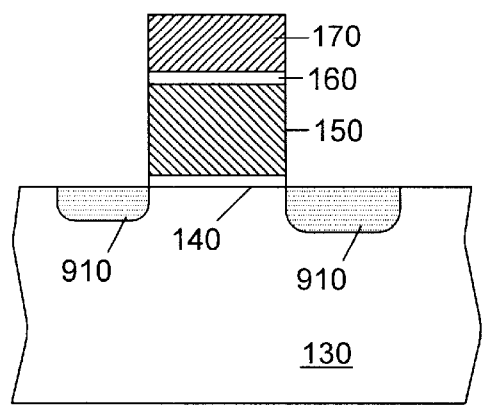
Figure 10:
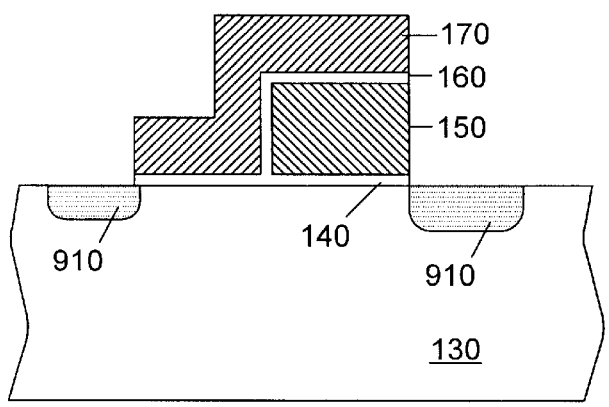
Figure 11:
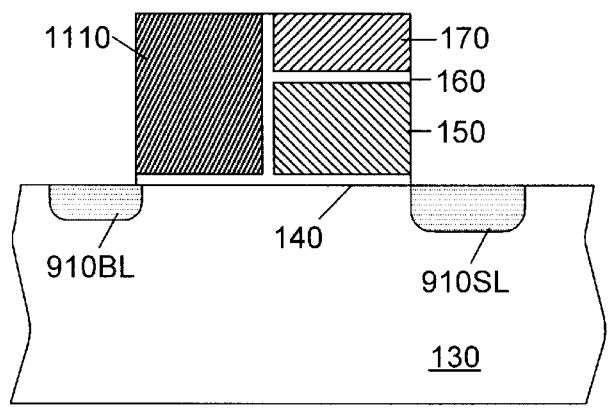
Figure 12:
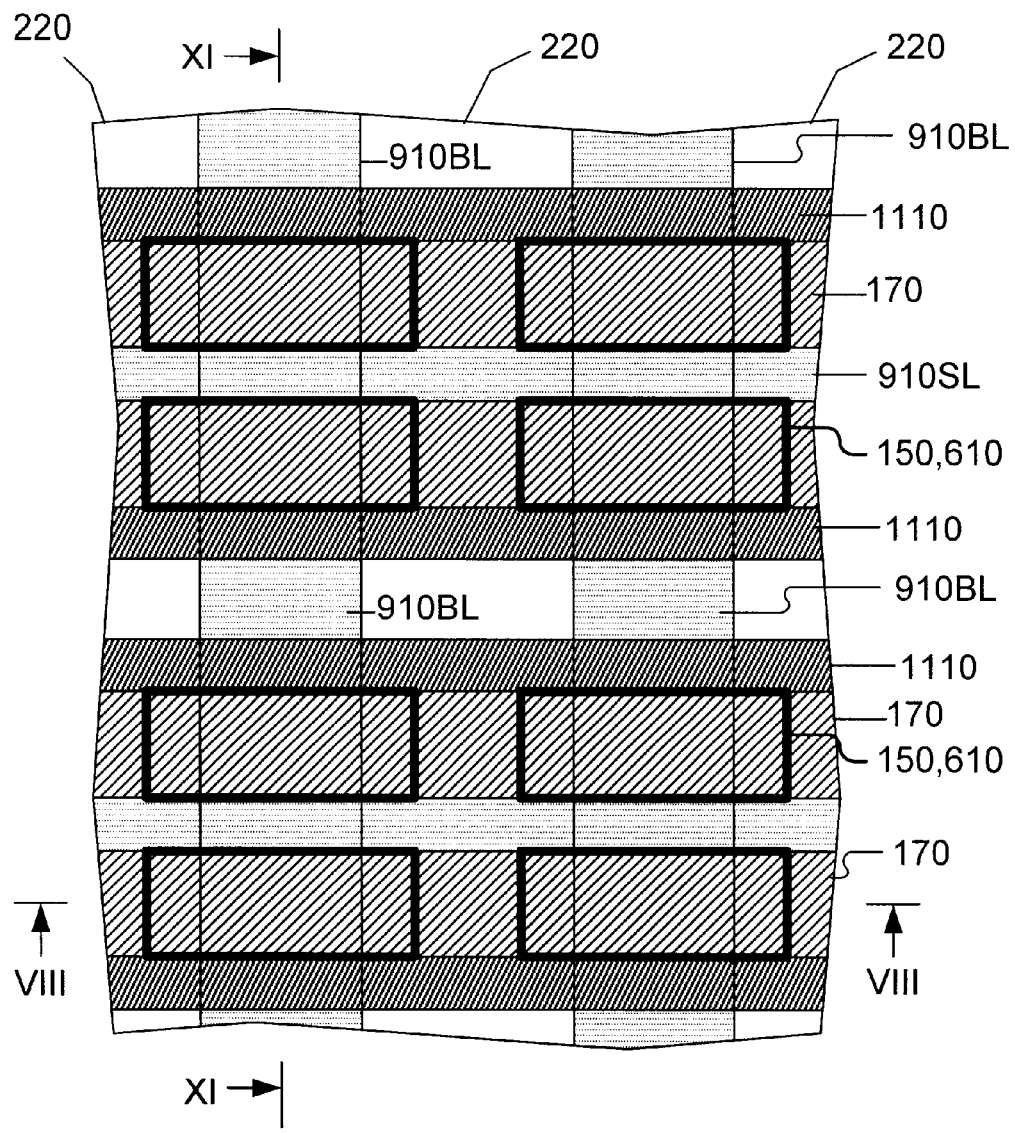
FIG. 12 is a top view of a semiconductor memory structure according to some embodiments of the present invention.

Other fabrication steps, such as doping of the source and drain regions, depend on a particular memory structure. Layer 610 can be incorporated into many memory structures, known or to be invented. FIGS. 9–11 illustrate some structures that can be modified to incorporate the layer 610. These figures illustrate the memory cross-sections by a plane shown as IX—IX in FIG. 8. This plane passes through layer 150 but not 610, and this plane is perpendicular to the cross-sectional plane of FIGS. 4–8. The memory cell source/drain regions are shown at 910. FIG. 9 illustrates a stacked gate memory cell, with each control gate line 170 overlying a number of floating gates made from layers 150, 610. (Layer 610 is not shown in FIG. 9.) See U.S. Pat. No. 6,013,551 issued Jan. 11, 2000 to Chen et al. FIG. 10 illustrates a split gate cell, in which the layer 170 provides a control gate and a select gate. FIG. 11 illustrates a cell in which the select gate is provided by a separate conductive layer 1110. Layer 1110 can be formed after the layer 170. Layer 1110 can be a doped polysilicon layer formed as a sidewall spacer. See aforementioned U.S. patent application Ser. No. 09/640,139. A top view is shown in FIG. 12. This is a flash memory. Region 910SL is a source line region, and region 910BL is a bit line region. Both are doped regions in substrate 130. Lines VIII—VIII mark the cross-sectional plane of FIG. 8. Lines XI—XI mark the cross-sectional plane of FIG. 11. Control gate lines 170 and wordlines 1110 extend in the "wordline" direction. Isolation trenches 220 extend through the memory array in the "bit line" direction, perpendicular to control gate lines 170. When polysilicon 170 is patterned, layers 150, 610, 160 are also patterned using the same mask, so that the layers 150, 610 are removed between the control gate lines 170. Then an insulator (not shown) is formed on the sidewalls of polysilicon layers 150, 610 to insulate these layers from wordlines (select gates) 1110. Then wordlines 1110 are formed. Then field oxide 134 is etched out of the trenches between adjacent control gate lines 170, and substrate 130 is doped between the control gate lines to form source lines 910SL. Each source line is shared by the memory cells corresponding to two control gate lines. The bit line regions 910BL are adjacent to the control gate lines on the opposite sides from the source lines.

As described in the aforementioned U.S. patent application Ser. No. 09/640,139, isolation trenches 220 can be interrupted at the location of source lines 910SL to eliminate the need to etch field oxide 134 out of the trenches.

Figure 5:
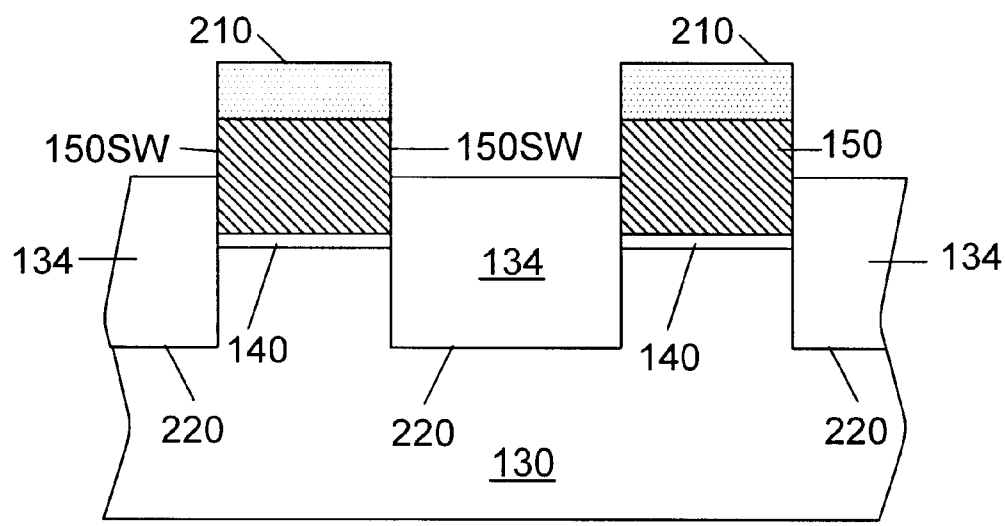

The invention is not limited to the structures and methods described above. The invention is not limited to any materials or fabrication processes. For example, in some embodiments, inter-poly dielectric 160 includes at least a portion of nitride 210 (FIG. 5). In such embodiment, nitride 210 is not removed after the etch of oxide 134, or nitride 210 is removed only partially. Further, nitride 210 can be replaced with silicon dioxide or some other material. In other embodiments, nitride 210 can be replaced with a conductive material. The invention is not limited to any memory programming or erase mechanisms. The invention is not limited to flash memories or any particular memory layout. The invention is defined by the appended claims.

What is claimed is:

1. A fabrication method comprising:
    forming a first layer over a semiconductor substrate, wherein the first layer is to provide a first portion of a floating gate for a nonvolatile memory cell;
    forming a layer L1 over the first layer;
    patterning the layer L1 to expose a sidewall of the layer L1;
    patterning the first layer to expose a sidewall of the first layer;
    forming a trench in the substrate;
    forming a first insulating layer over the layer L1 and in the trench;
    polishing the first insulating layer by a process that stops on the layer L1;
    etching the first insulating layer to expose the sidewall of the layer L1 and a top portion of the sidewall of the first layer but not a bottom portion of the sidewall of the first layer;
    forming a spacer over the sidewall of the layer L1 and over the top portion of the sidewall of the first layer, the spacer physically contacting the top portion of the sidewall of the first layer but not the bottom portion of the sidewall of the first layer, wherein at least a part of the spacer forms a second portion of the floating gate, wherein said part of the spacer is positioned over the sidewall of the layer L1 and over the top portion of the sidewall of the first layer and is in physical contact with the top portion of the sidewall of the first layer, wherein the spacer and the layer L1 are made of different materials, and wherein the layer L1 is at least as thick as a height of a portion of the spacer over the sidewall of the first layer.

2. The method of claim 1 further comprising forming a second insulating layer over the first layer and the spacer, and forming a control gate for the nonvolatile memory cell over the second insulating layer, the control gate being insulated from the floating gate by the second insulating layer, wherein the floating gate is insulated from the semiconductor substrate.

3. The method of claim 2 further comprising removing the layer L1 before forming the second insulating layer.

4. The method of claim 1 further comprising removing the layer L1.

5. The method of claim 4 wherein the layer L1 is at least 85 nm thick.

6. The method of claim 1 further comprising forming a gate dielectric to separate the first portion of the floating gate from the substrate.

7. The method of claim 6 wherein the first insulating layer and the gate dielectric each comprise silicon dioxide.

8. The method of claim 1 wherein said operations of the patterning of the layer L1, the patterning of the first layer, and the forming of the trench are performed using a single photolithographic mask.

9. A fabrication method comprising:
    forming a gate dielectric over a semiconductor substrate;
    forming a first layer over the gate dielectric to provide a first portion of a floating gate for a nonvolatile memory cell;
    forming a layer L1 over the first layer, and exposing a sidewall of the layer L1 and at least a portion of a sidewall of the first layer;
    forming a spacer over the sidewall of the layer L1 and at least said portion of the sidewall of the first layer, the spacer physically contacting said portion of the sidewall of the first layer, wherein at least a part of the spacer forms a second portion of the floating gate, wherein said part of the spacer is positioned over the sidewall of the layer L1 and over said portion of the sidewall of the first layer and is in physical contact with said portion of the sidewall of the first layer;
    removing the layer L1 from over the first portion of the floating gate;
    forming an insulating layer over the first layer and the spacer;
    forming a conductive layer over the insulating layer to provide a control gate for the nonvolatile memory cell;
    patterning the conductive layer and the spacer to remove the spacer on at least one side of the first portion of the floating gate;
    wherein a part of the spacer over the sidewall of the layer L1 is at least as tall as a part of the spacer over the sidewall of the first layer.

10. The method of claim 9 wherein the part of the spacer over the sidewall of the layer L1 is taller than the part of the spacer over the sidewall of the first layer.

11. The method of claim 9 wherein the layer L1 is dielectric.

12. The method of claim 9 further comprising, after the patterning of the conductive layer and the spacer, introducing dopant into the substrate adjacent to said side of the first portion of the floating gate to form a source/drain region for the memory cell.

13. The method of claim 9 wherein the spacer and the layer L1 are made of different materials, and the layer L1 is at least 85 nm thick.

14. The method of claim 13 wherein the layer L1 is dielectric.

15. The method of claim 13 further comprising, after the patterning of the first layer and the spacer, introducing dopant into the substrate adjacent to said side of the first portion of the floating gate to form a source/drain region for the memory cell.

16. A fabrication method comprising:
    forming a first layer over a semiconductor substrate, wherein the first layer is to provide a first portion of a floating gate for a nonvolatile memory cell;
    forming a layer L1 over the first layer;
    patterning the layer L1 to expose a sidewall of the layer L1;
    patterning the first layer to expose a sidewall of the first layer;
    forming a trench in the substrate;
    forming a first insulating layer in the trench, the first insulating layer also covering a bottom portion of the sidewall of the first layer;
    forming a spacer over the sidewall of the layer L1 and over the top portion of the sidewall of the first layer, the spacer physically contacting the top portion of the sidewall of the first layer but not the bottom portion of the sidewall of the first layer, wherein at least a part of the spacer forms a second portion of the floating gate, wherein said part of the spacer is positioned over the sidewall of the layer L1 and over the top portion of the sidewall of the first layer and is in physical contact with the top portion of the sidewall of the first layer;
    wherein a part of the spacer over the sidewall of the layer L1 is at least as tall as a part of the spacer over the sidewall of the first layer.

17. The method of claim 16 wherein the part of the spacer over the sidewall of the layer L1 is taller than the part of the spacer over the sidewall of the first layer.

18. The method of claim 16 wherein the layer L1 is dielectric.

19. The method of claim 16 wherein forming the spacer comprises:
    forming a layer L2 over the layer L1; and
    etching the layer L2 anisotropically to form the spacer and expose, but not remove, the layer L1.

20. The method of claim 19 further comprising, after forming the spacer, removing the layer L1 without removing a spacer portion that was located over the sidewall of the layer L1.

21. The method of claim 16 wherein the patterning of the layer L1, the patterning of the first layer, and the forming of the trench are performed using a single photolithographic mask.

22. The method of claim 16 further comprising forming a gate dielectric over the substrate before forming the first layer, wherein the gate dielectric separates the first portion of the floating gate from the substrate.

23. The method of claim 16 further comprising:
forming a second insulating layer over the first layer and the spacer;
forming a second layer over the second insulating layer, wherein the second layer is to provide a conductive control gate for the nonvolatile memory cell;
patterning the second layer, the second insulating layer, the first layer and the spacer to remove parts of the first layer and the spacer around the floating gate.

24. The method of claim 23 further comprising, after the patterning of the second layer, the second insulating layer, the first layer and the spacer, introducing dopant into the substrate to form a source/drain region adjacent to the first portion of the floating gate where a part of the spacer was removed.

25. The method of claim 16 wherein the spacer and the layer L1 are made of different materials, and the layer L1 is at least 85 nm thick.

26. The method of claim 25 wherein the layer L1 is dielectric.

27. The method of claim 25 wherein forming the spacer comprises:
forming a layer L2 over the layer L1; and
etching the layer L2 anisotropically to form the spacer and expose, but not remove, the layer L1.

28. The method of claim 25 further comprising, after forming the spacer, removing the layer L1 without removing a spacer portion that was located over the sidewall of the layer L1.

29. The method of claim 25 wherein the patterning of the layer L1, the patterning of the first layer, and the forming of the trench are performed using a single photolithographic mask.

30. The method of claim 25 further comprising forming a gate dielectric over the substrate before forming the first layer, wherein the gate dielectric separates the first portion of the floating gate from the substrate.

31. The method of claim 25 further comprising:
forming a second insulating layer over the first layer and the spacer;
forming a second layer over the second insulating layer, wherein the second layer is to provide a conductive control gate for the nonvolatile memory cell;
patterning the second layer, the second insulating layer, the first layer and the spacer to remove parts of the first layer and the spacer around the floating gate.

32. The method of claim 31 further comprising, after the patterning of the second layer, the second insulating layer, the first layer and the spacer, introducing dopant into the substrate to form a source/drain region adjacent to the first portion of the floating gate where a part of the spacer was removed.

* * * * *